United States Patent
Malinin et al.

(10) Patent No.: US 9,705,559 B2
(45) Date of Patent: Jul. 11, 2017

(54) METHOD AND APPARATUS FOR POWERING A PORTABLE DEVICE

(71) Applicant: Dialog Semiconductor (UK) Limited, Reading (GB)

(72) Inventors: Andrey Malinin, Campbell, CA (US); Lasse Harju, Germering (DE); Wessel Lubberhuizen, 's-Hertogenbosch (NL)

(73) Assignee: Dialog Semiconductor (UK) Limited, Reading (GB)

( * ) Notice: Subject to any disclaimer, the term of this patent is extended or adjusted under 35 U.S.C. 154(b) by 336 days.

(21) Appl. No.: 14/537,439

(22) Filed: Nov. 10, 2014

(65) Prior Publication Data

US 2016/0134381 A1 May 12, 2016

(51) Int. Cl.
   *G01R 31/02* (2006.01)
   *H04B 3/46* (2015.01)
   *H04B 1/707* (2011.01)
   *G01R 31/28* (2006.01)

(52) U.S. Cl.
   CPC ............. *H04B 1/707* (2013.01); *G01R 31/02* (2013.01); *G01R 31/021* (2013.01); *H04B 3/46* (2013.01); *G01R 31/2812* (2013.01)

(58) Field of Classification Search
   CPC .......... H04B 1/707; H04B 3/46; G01R 31/00; G01R 31/002; G01R 31/02; G01R 31/021; G01R 31/08; G01R 31/28; G01R 31/2812
   USPC ....... 324/500, 512, 522, 523, 525, 527, 537, 324/539, 543, 713; 702/1, 57, 64
   See application file for complete search history.

(56) References Cited

U.S. PATENT DOCUMENTS

| 5,780,992 | A  | * | 7/1998 | Beard    | H01M 2/1027 |
|-----------|----|---|--------|----------|-------------|
|           |    |   |        |          | 320/106     |
| 5,883,437 | A  | * | 3/1999 | Maruyama | G02F 1/136286 |
|           |    |   |        |          | 257/529     |
| 7,269,521 | B2 | * | 9/2007 | Hsu      | G06F 17/5036 |
|           |    |   |        |          | 702/57      |
| 8,375,231 | B2 | * | 2/2013 | Landry   | H04L 12/10  |
|           |    |   |        |          | 713/300     |

(Continued)

OTHER PUBLICATIONS

"Spread Spectrum for Mobile Communications," by Raymond L. Pickholtz, et al., IEEE Transactions on Vehicular Technology, vol. 40, No. 2, May 1991, pp. 313-322.

(Continued)

*Primary Examiner* — Hoai-An D Nguyen
(74) *Attorney, Agent, or Firm* — Saile Ackerman LLC; Stephen B. Ackerman

(57) ABSTRACT

A method of monitoring a process of powering a portable device through a cable connected between a power supply and a portable device is presented. The method includes applying a time-dependent current variation to one end of the cable in accordance with a spreading sequence, detecting a time-dependent voltage variation at the one end of the cable, the time dependent voltage variation resulting from the applying of the time-dependent current variation, and determining a quantity indicative of an impedance of the cable assembly based on the time-dependent voltage variation and the spreading sequence. Further, an apparatus for monitoring a process of powering a portable device through a cable connected between a power supply and a portable device is presented.

23 Claims, 6 Drawing Sheets

(56) References Cited

U.S. PATENT DOCUMENTS

2001/0038314 A1* 11/2001 Ichimaru .............. H03L 7/1976
　　　　　　　　　　　　　　　　　　　　　　　　　　　331/10
2014/0086418 A1　　3/2014　Lubberhuizen et al.

OTHER PUBLICATIONS

Digital Communication, Third Edition, by John R. Barry, et al., Copyright 2004 by Springer Science & Business Media, NY, pp. 131-184.
"Battery Charging Specification," Revision 1.2, pp. 1-60, published: www.usb.org/developers/docs/devclass_docs, Dec. 7, 2010.

* cited by examiner

METHOD AND APPARATUS FOR POWERING A PORTABLE DEVICE

TECHNICAL FIELD

This application relates to a method and apparatus for monitoring a process of powering a portable device, such as a process of charging a battery-powered device. The method and apparatus are particularly applicable to charging processes of mobile devices, such as mobile telephones, PDAs, tablet computers, and notebooks, through pluggable standardized cables, such as USB cables.

BACKGROUND

Methods for powering portable devices through cables are known in the art. For instance, a battery-powered device may be charged by connecting it to a wall-plug adaptor including a power converter through a pluggable (removable) standardized cable, such as a USB cable. The charger circuit in the battery-powered device is responsible of limiting the current delivered over the standardized cable in order to prevent over-heating of connectors and the cable itself. Being standardized, the cable connecting the wall-plug adaptor to the mobile device can, be replaced with any other cable the connectors of which seem to conform to the same standard, but which is of lower quality (sub-standard cable). Therefore, the current limit has to be set low enough so that low-quality cables or an increased connector impedance, caused by connector wear over time or dirt caught between the plug and the receptacle, will not present a safety risk during charging.

In existing solutions, the current limit is based on specifications of the relevant standard, e.g. specifications of the USB standard, and evaluations done by the device manufacturer.

However, such existing solutions do not account for removable cables of low quality, the connectors of which seem to conform to the given standard (i.e. fit into respective receptacles of the mobile device and the wall-plug adaptor), but which themselves do not meet the specifications of the given standard (i.e. substandard cables). Using such removable cables may result in damage to the wall-plug adaptor or the battery-powered device. Moreover, such existing solutions do not account for an increase of the impedance of a cable caused by dust or by wear and tear. Also, fixedly setting the current limit on the basis on specifications of the relevant standard may not allow charging the battery-powered device with the highest possible current under all circumstances.

SUMMARY

There is a need for a method and an apparatus for monitoring a quality of a cable used during a process of powering (e.g. charging) of a portable device (e.g. a battery-powered device) and for dynamic limiting of the input power during the process of powering depending on the detected quality of the cable. In view of this problem, the present invention provides a method of monitoring a process of powering a portable device (e.g. a process of charging a battery-powered device) and an apparatus for monitoring a process of powering a portable device (e.g. a process of charging a battery-powered device).

An aspect of the present disclosure relates to a method of monitoring a process of powering a portable device through a cable connected between a power supply and said portable device. The method comprises imposing a time-dependent current variation to one end of the cable in accordance with a spreading sequence, detecting a time-dependent voltage variation at the one end of the cable, the time dependent voltage variation resulting from said imposing of the time-dependent current variation, and determining a quantity indicative of an impedance of the cable assembly based on the time-dependent voltage variation and the spreading sequence. The spreading sequence has a plurality of (equal-length) symbol periods, during each of which one of at least two possible symbols (symbol values) is attained. That is, the spreading sequence can be said to have at least two different levels, either one of which may be attained during each of the plurality of symbol periods. Imposing the time-dependent current variation (current modulation) may be achieved by drawing a time-dependent current from the one end of the cable. The cable may be a pluggable (removable) cable e.g. with standardized connectors. In the above, the cable assembly is understood to relate to the entire power delivery path and to include the connectors of the cable, any printed circuit board (PCB) traces, and the cable itself. In embodiments, the quantity indicative of an impedance of the cable assembly may be a quantity indicative of the resistive part (real part) of the impedance of the cable assembly.

Configured as above, the proposed method enables monitoring the process of powering the portable device (e.g. charging a battery-powered device) and determining an impedance of the cable assembly without requiring any kind of communication between the portable device and the power supply. For this reason, the method is independent of type and specifications of the power supply, and may thus be applied to any power supply suitable for powering the portable device. Likewise, the method operates independently of type and specifications of the cable, in particular regardless of a connection standard. By applying the time-dependent current variation (i.e. a time-dependent variation of the load to the power supply) to one end of the cable and detecting a time-dependent voltage variation at the same end of the cable, the impedance of the cable assembly, i.e. the total impedance of the power delivery path, may be measured, including the connectors of the cable, any printed circuit board traces, and the cable itself. In consequence, the method yields reliable and accurate results for the impedance of the cable assembly regardless of a powering system (e.g. charging system) to which the method is applied, and therefore enables reliable control of the powering process. This allows to effectively prevent damages to either of the power supply, the portable device or the cable due to excessive heating of the cable and the connectors.

In embodiments, the method may further comprise generating the spreading sequence according to a defined scheme. Accordingly, the spreading sequence does not need to be stored and may be adapted to circumstances.

In embodiments, the spreading sequence may be a pseudo-random or random sequence. By using a pseudo-random or random sequence, a spread-spectrum so approach is adopted for determining the impedance of the cable assembly. Such configured, a (pseudo-)randomly modulated current is drawn over the cable. The (pseudo-)random nature of the modulation makes the determination of the quantity indicative of the impedance immune with respect to frequency and amplitude of any AC-component of the wall-plug adaptor output voltage. The reason is that using a (pseudo-)random spreading sequence allows to avoid aliasing with the power supply switching frequency ripple, i.e. with peaks in the spectrum of the power supply voltage. Moreover, when a (pseudo-)random current modulation is used, the amplitude of the time-dependent voltage variation can be conveniently determined by calculating the cross-correlation between the time-dependent voltage variation and the (pseudo-)random spreading sequence. Using a (pseudo-)random spreading sequence further minimizes audible noise, which could otherwise be produced by the current modulation.

In embodiments, the spreading sequence is a binary sequence. That is, during each symbol period, one of two possible symbol values may be attained, e.g. symbol values ±1 or 0, 1. In the binary sequence, each of these symbol values is attained in a plurality of symbol periods, e.g. symbol value +1 is attained in a plurality of symbol periods, and symbol value −1 is attained in a plurality of symbol periods.

In embodiments, the method may further comprise correlating, i.e. cross-correlating, the time-dependent voltage variation with the spreading sequence. This corresponds to a de-spreading of the time-dependent voltage variation by the spreading sequence. The result of this (cross-)correlating corresponds to an amplitude of the voltage variation. The quantity indicative of the impedance of the cable assembly may then be calculated based on the result of the correlation of the time-dependent voltage variation with the spreading sequence. Calculating the quantity indicative of the impedance may be performed by dividing the result of the correlation by an amplitude of the time-dependent current variation, e.g. a current gain of a current sink generating the time-dependent current variation. By cross-correlating the time-dependent voltage variation with the spreading sequence, perturbations of the determination of the impedance originating from the powering system are removed, and even a small amplitude of the voltage variation can be reliably detected.

Said correlating may involve multiplying the time-dependent voltage variation and the spreading sequence. This may involve appropriately shifting the levels of the time-dependent voltage variation and the spreading sequence by removing respective constant components, i.e. centering the time-dependent voltage variation and the spreading sequence around their respective zero levels, or center levels. Said correlating may further involve averaging over time (i.e. time-averaging) the result of said multiplication. The averaging period corresponds to the period (length, duration) of the spreading sequence. The result of this time-averaging corresponds to the amplitude of the voltage variation. The quantity indicative of the impedance of the cable assembly may then be calculated based on the obtained time average of the multiplication of the time-dependent voltage variation with the spreading sequence. Calculating the quantity indicative of the impedance may be performed by dividing the obtained time average by the amplitude of the time-dependent current variation.

In embodiments, the time-dependent voltage variation and/or the spreading sequence may be shifted in phase relative to each other so that the time-dependent voltage variation and the spreading sequence are synchronized (i.e. aligned) with each other. In general, the detected time-dependent voltage variation resulting from the current modulation and the spreading sequence controlling the current modulation are synchronous to good approximation. Any remaining phase shift, e.g. resulting from times required for passing through respective filters or converters, or along the cable, can be removed by the phase shifting operation.

In embodiments, the spreading sequence (and correspondingly, the time-dependent current variation) may have a given length, and the time-averaging involves performing a time-integration of the result of the multiplication, over the given length of the spreading sequence. The given length of time of the spreading sequence is understood to relate to a duration of the spreading sequence and is given by the number of symbol periods in the spreading sequence times the symbol period.

In embodiments, detecting the time-dependent voltage variation may involve detecting a time-dependent voltage signal at the one end of the cable, and removing (filtering) a DC component of the time dependent voltage signal. Thereby, the time-dependent voltage variation caused by applying the time-dependent current variation can be reliably and conveniently determined.

In embodiments, the amplitude of the time-dependent current variation (i.e. the amplitude of current modulation) may be chosen such that the time-dependent voltage variation is small compared to a voltage for powering the portable device, i.e. a voltage output by the power supply. In other words, the amplitude of the time-dependent current variation may be chosen small compared to a current for powering the portable device, i.e. a current output by the power supply. This avoids interference with the actual process of powering the portable device. Since the de-spreading gain resulting from using the spread-spectrum approach provides for good protection against any narrowband noise in the powering system, including the switching noise of the power supply, the amplitude of the (pseudo-random or random) current modulation can be kept low without compromising accuracy of the determination of the impedance.

In embodiments, the method may comprise comparing values of the quantity indicative of the impedance of the cable assembly obtained at different timings, and determining a rate of change of the quantity indicative of the impedance of the cable assembly based on the result of said comparison. Thereby, trends in the change of the impedance of the cable assembly over time can be identified, and preemptive measures for avoiding damage to the cable and the receptacles of the power supply and the portable device can be taken, if necessary. Such preemptive measures include reducing a current and/or voltage for powering the portable device or stopping powering of the portable device altogether.

In embodiments, the method may further comprise regulating a current and/or a voltage for powering the portable device (i.e. a current and/or a voltage output by the power supply) in accordance with the determined quantity indicative of the impedance of the cable assembly. In general, an output power of the power supply may be regulated. Thereby, powering of the portable device with an optimum output power of the power supply can be ensured, without risking damage to the cable or to the receptacles of the power supply and the portable device for receiving the connectors of the cable.

In embodiments, the cable may be a pluggable cable (removable cable) with standardized connectors, e.g. according to the USB standard. Further, the power supply may be a switched power supply, i.e. a power supply in which an output voltage lower than an input voltage is obtained by a switching operation of a power switch or pass device. The switched power supply may comprise a fly-back converter or a buck converter.

Another aspect of the disclosure relates to an apparatus for monitoring a process of powering a portable device through a cable connected between a power supply and said portable device. The apparatus comprises a controllable (i.e. regulated) current sink for imposing a time-dependent current variation to one end of the cable in accordance with a spreading sequence, voltage detecting means for detecting a time-dependent voltage variation at the one end of the cable, the time dependent voltage variation resulting from said imposing of the time-dependent current variation, and computing means for determining a quantity indicative of an impedance of the cable assembly based on the time-dependent voltage variation and the spreading sequence. The current sink may impose the time-dependent current variation to one end of the cable by drawing a time-dependent current that is controlled in accordance with the spreading sequence. In the above, the cable assembly is understood to relate to the entire power delivery path and to include the connectors of the cable, any printed circuit board (PCB) traces, and the cable itself. In embodiments, the quantity indicative of an impedance of the cable assembly may be a quantity indicative of the resistive part (real part) of the impedance of the cable assembly.

In embodiments, the apparatus may further comprise a sequence generator for generating a spreading sequence of a given length. The binary spreading has a plurality of (equal-length) symbol periods, during each of which one of at least two possible symbols (symbol values) is attained. The sequence generator may be adapted to generate the spreading sequence as a pseudo-random or random sequence. The sequence generator may be further adapted to generate the spreading sequence as a binary sequence. The sequence generator may comprise a linear feedback shift-register structure. The linear feedback shift-register structure consists of a plurality of shift registers connected in series and one or more logical XOR gates connected in series, wherein the outputs of a given subset of the shift-registers is fed to respective corresponding XOR gates, and the output of the series connection of XOR gates is fed back to the first shift-register.

In embodiments, the apparatus may further comprise a pulse-shaping filter for generating a control signal (modulation signal) for controlling the current sink based on the spreading sequence as input signal. The pulse-shaping filter may be a finite impulse filter, such as a raised cosine filter. Providing a pulse-shaping filter allows to bandwidth-limit the current modulation to a given frequency range, such as the frequency range in which the impedance of the cable is mostly resistive.

In embodiments, the computing means may comprise a multiplicator adapted to invert the time-dependent voltage variation in accordance with the spreading sequence (i.e. to multiply the time-dependent voltage variation and the spreading sequence), a numerical integrator adapted to time-average the result of said multiplication, and an impedance calculator adapted to calculate the quantity indicative of the impedance of the cable assembly based on the time average. Therein, the multiplication and subsequent integration can be said to correspond to a (cross-)correlation of the time-dependent voltage variation with the spreading sequence, so that the multiplicator and the numerical integrator can be said to form a correlator adapted for correlating the time-dependent voltage variation with the spreading sequence.

In embodiments, the computing means may further comprise a phase shifter (phase controller) for synchronizing the time-dependent voltage variation with the spreading sequence, by shifting the phase of either or both of the time-dependent voltage variation and the spreading sequence. In other words, the phase shifter achieves synchronization (alignment) of the generation and detection of the time-dependent voltage variation. As indicated above, the multiplicator may be adapted to multiply, after synchronization, the time-dependent voltage variation with the spreading sequence. In other words, the multiplicator is adapted to perform instantaneous multiplications of a value of the spreading sequence and a value of the time-dependent voltage variation. The result of this multiplication is an approximately constant signal, the magnitude of which corresponds to the amplitude of the time-dependent voltage variation and is proportional to the impedance of the cable assembly.

In embodiments, the spreading sequence (and correspondingly, the time-dependent current variation) may have a given length, and the numerical integrator may be adapted to time-average the result of said multiplication by performing a time integration, over the given length, of the result of said multiplication.

In embodiments, the voltage detecting means may be adapted to detect a time-dependent voltage signal at the one end of the cable, and the apparatus may comprise a filter adapted to remove (filter) a DC component of the time dependent voltage signal. The filter may be e.g. a band pass filter or a high pass filter, and also reduces noise. The filter may be matched with a pulse shape of the pulse-shaping filter.

In embodiments, the current sink may be adapted to apply the time-dependent current variation in such a manner that the amplitude of the time-dependent voltage variation is small compared to a voltage for powering the portable device. Correspondingly, the current sink may be adapted to apply the time-dependent current variation in such a manner that the amplitude of the time-dependent current variation is small compared to a current for powering the portable device.

In embodiments, the computing means may be adapted to compare values of the quantity indicative of the impedance of the cable assembly obtained at different timings, and to determine a rate of change of the quantity indicative of the impedance of the cable assembly on the basis of the result of said comparison. This allows identifying the trend of the quantity indicative of the impedance to respond to changes of the quantity before damage may occur.

In embodiment, the apparatus may comprise a controller (e.g. a charger controller) for controlling a current and/or a voltage for powering the portable device in accordance with the determined quantity indicative of an impedance of the cable assembly and/or the rate of change of the quantity. The controller may be adapted to control a load current (e.g. a battery current of a battery) of the portable device. The current flowing through the cable is determined by the load current and the ratio of the load voltage (e.g. the battery voltage) and the input voltage (i.e. the output voltage of the power supply). The controller may be further adapted for instructing, in accordance with the determined quantity indicative of an impedance of the cable assembly and/or the rate of change of the quantity, the power supply to adjust a current limit of the power supply.

It will be appreciated that the method steps and apparatus features may be interchanged in many ways. In particular, the details of the disclosed apparatus can be implemented as a method, and the disclosed method steps implemented as apparatus features, as the skilled person will appreciate. Any statements made with respect to the above method steps are understood to also relate to corresponding apparatus features, to the extent that they are applicable.

BRIEF DESCRIPTION OF THE DRAWINGS

The invention is explained below in an exemplary manner with reference to the accompanying drawings, wherein FIG. 1 schematically illustrates a charging system as an example of a powering system to which embodiments of the invention may be applied.

DESCRIPTION

It should be noted that the methods and apparatus including its preferred embodiments as outlined in the present disclosure may be used stand-alone or in combination with the other methods and apparatus disclosed in this document. Furthermore, all aspects of the methods and apparatus outlined in the present disclosure may be arbitrarily combined. In particular, the features of the claims may be combined with one another in an arbitrary manner. Further, if not explicitly indicated otherwise, embodiments can be freely combined with each other.

In the following, reference will be made to a charging system, which exemplarily embodies a powering system. The disclosure is not to be understood to be limited to a charging system, or to charging of a battery-powered device, but is to be understood to generally relate to a powering system and to powering a portable device.

Figure 1:
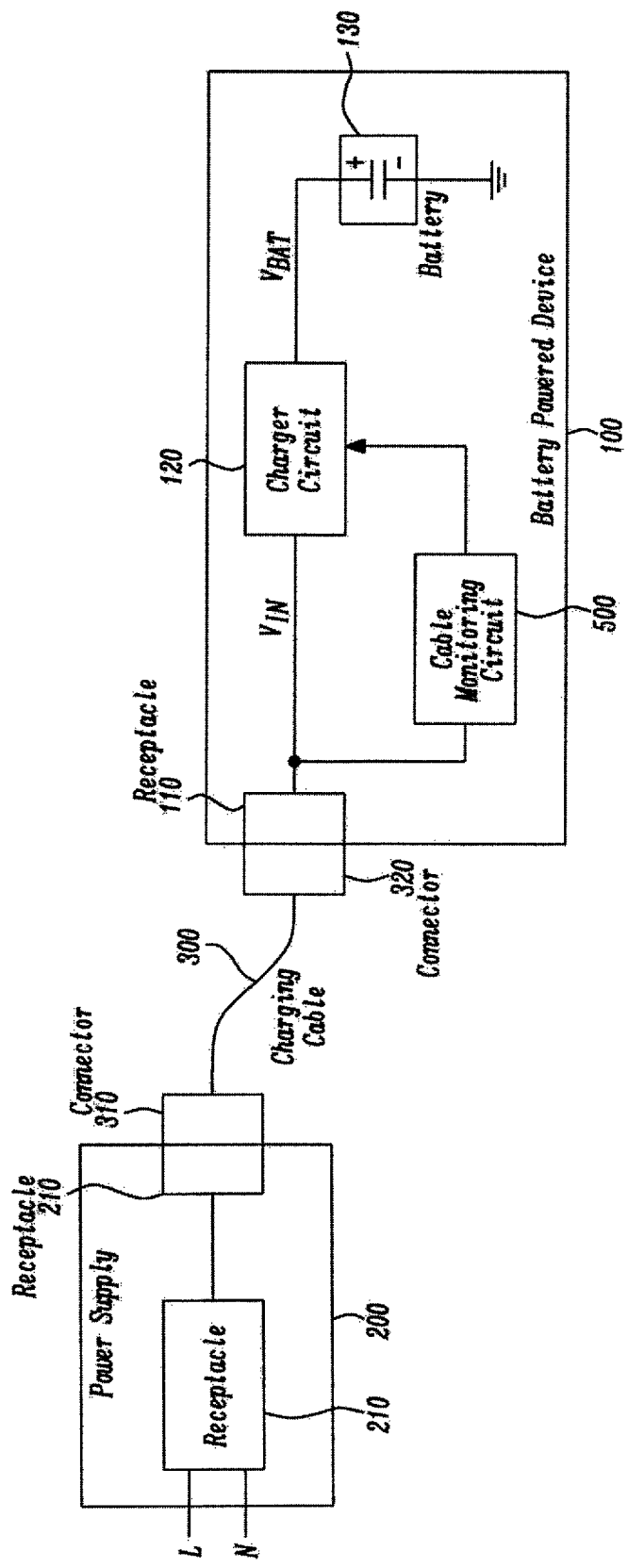

A high-level system block diagram of a charging system as an example of a powering system to which embodiments of the present invention may be applied is illustrated in FIG. 1. A mobile device 100 (exemplarily embodying a portable device such as a battery-powered device) is connected to a power supply 200, such as a wall-plug adaptor, via a charging cable 300 (exemplarily embodying a cable). The charging cable 300 is a pluggable (removable) cable and has connectors 310, 320 that are standardized connectors according to a given connection standard or charging standard, such as the USB standard, for example. The power supply 200 has a receptacle 210 for receiving at least one of the connectors of the charging cable 300, and the mobile device 100 has a receptacle 110 for receiving at least the other one of the connectors of the charging cable 300. The receptacles are standardized receptacles according to the same given connection standard or charging standard as the connectors 310, 320 of the charging cable 300, such as the USB standard, for example. Providing standardized receptacles 110, 210 allows a user of the charging system to use any compatible cable for charging the mobile device 100.

The power supply 200 comprises an AC/DC current converter 210 for converting an alternating input current to a dual output current. The AC/DC current converter may be a switched converter, such as a fly-back converter or a buck converter, and the power supply 200 may be a switched power supply.

The mobile device 100 comprises a charger circuit 120 performing functionalities related to the process of charging a battery 130 of the mobile device 100 (exemplarily embodying a circuit performing functionalities related to the process of powering the portable device). The charger circuit 120 may have a function of controlling the power supply 200 to output a given (charging) current and/or given (charging) voltage, e.g. by exchanging messages according to the connection standard or charging standard. The mobile device 100 further comprises an impedance measurement circuit (circuit for cable monitoring, cable monitoring circuit) that performs cable monitoring by determining an impedance (exemplarily embodying a quantity indicative of the impedance) of the cable assembly including the charging cable (pluggable cable, removable cable) 300.

Monitoring the impedance of the cable assembly allows to account for the quality of the pluggable cable 300, which may vary between different pluggable cables that the user might revert to for connecting between the power supply 200 and the mobile device 100, and for aging of the pluggable cable 300. In accordance with a result of the cable monitoring, the input power of the charging circuit 120 (output power of the power supply 200) may be adjusted depending on the quality (i.e. impedance, or resistive part of the impedance) of the pluggable cable 300. The cable monitoring may run in parallel to the normal charging functionality (exemplarily embodying the powering functionality). As will be seen below, the cable monitoring does not require any input from the user and may be applied to any pluggable cable and to any power supply without requiring any additional communication between the mobile device 100 (i.e. the charging circuit 120) and the power supply 200.

Figure 2A:
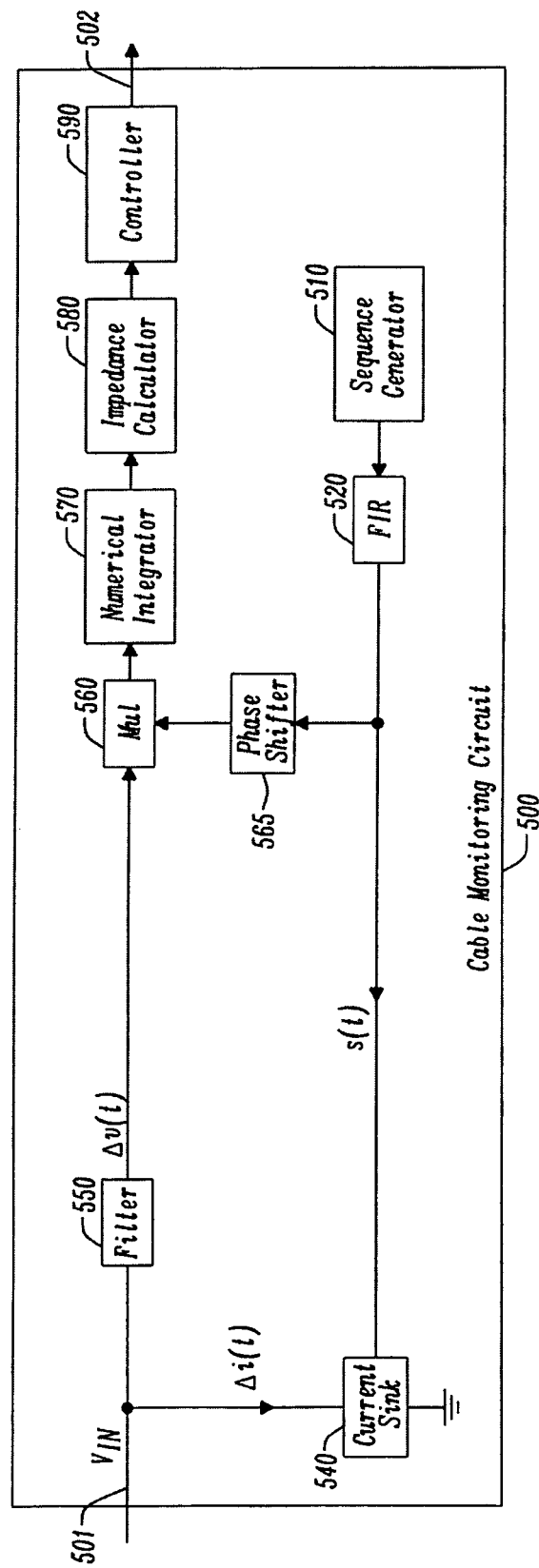
FIGS. 2A and 2B are block diagrams schematically illustrating circuits for cable monitoring according to embodiments of the invention.

FIG. 2A is a block diagram schematically illustrating the circuit for cable monitoring (cable monitoring circuit) 500, i.e. circuit for determining an impedance of the cable assembly, according to embodiments of the invention. The cable monitoring circuit 500 may be provided within the mobile device 100 and may be provided separate from or integrated with charging circuitry for performing the functionality of battery charging.

The cable monitoring circuit comprises an input node 501, an output node 502, a sequence generator 510, a pulse-shaping filter 520, a controllable current sink 540, a filter 550, a multiplicator 560, a phase shifter (phase controller) 565, a numerical integrator 570, an impedance calculator 580, and a controller 590. The filter 550 is a filter for removing a constant component from an input signal. In embodiments, the filter 550 may be e.g. a band pass filter (BPF) or a high pass filter (HPF). The filter 550 may be used to match the pulse shape of the pulse-shaping filter 520. The multiplicator 560, the phase shifter 565, the numerical integrator 570, and the impedance calculator 580 may be comprised by a computing means.

Figure 2B:
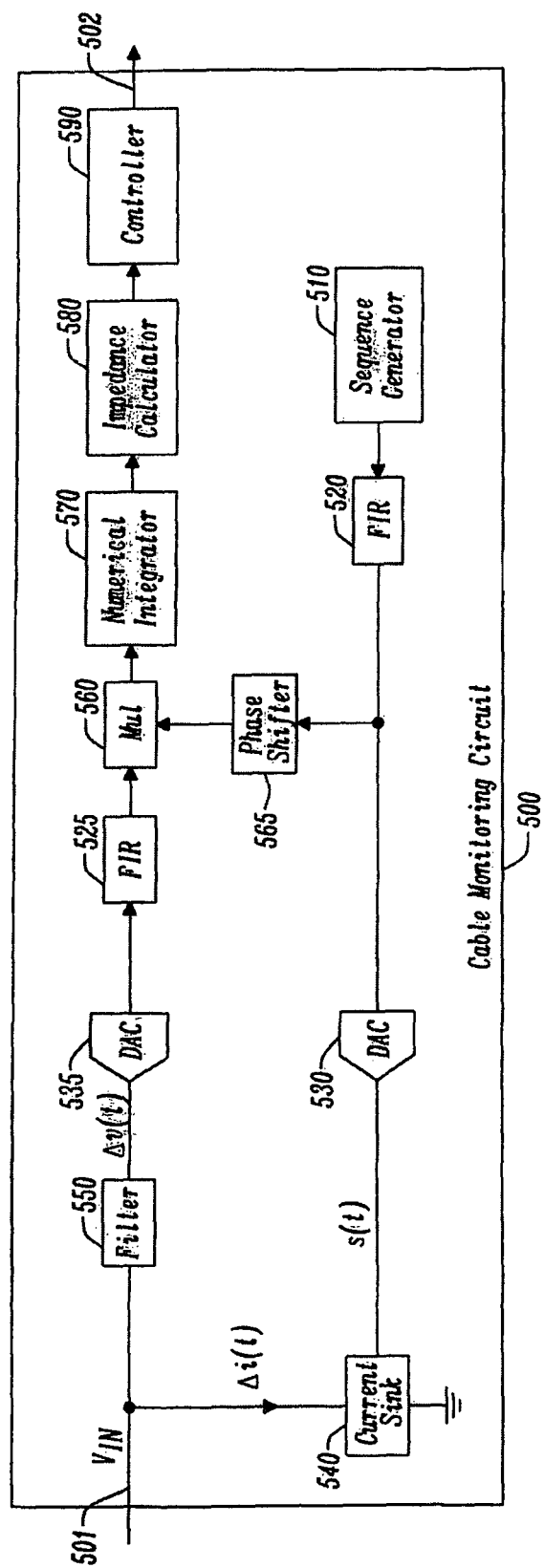

Optionally, as illustrated in the embodiment of FIG. 2B, the cable monitoring circuit may further comprise a digital-to-analog converter (DAC) 530 and an analog-to-digital converter (ADC) 535. If the cable monitoring circuit comprises the ADC 535, the filter 550 is a BPF. The cable monitoring circuit may further comprise a second pulse-shaping filter 525 matched to the pulse shape of the (first) pulse-shaping filter 520. The first and second pulse-shaping filters 520, 525 may be finite impulse response (FIR) filters, such as raised cosine filters.

The sequence generator 510 outputs a spreading sequence of a given length (duration) and with a given symbol period. The spreading sequence may be a pseudo-random or random sequence. During each of plural symbol periods of the spreading sequence, one of at least two symbols (symbol values) is attained. The current sink 540 introduces an additional load to the power supply 200 (besides the load applied by the charging circuitry) controlled by the spreading sequence, after pulse-shape filtering by the pulse-shaping filter 520 and optional digital-to-analog conversion by the DAC 530. The generated current levels corresponding to the levels of the spreading sequence can be adjusted, i.e. a current gain (current modulation amplitude) of the current sink 540 can be adjusted. The filter 550 removes the DC component from the time-dependent input voltage, i.e. the time-dependent voltage that is detected at the mobile-device-side end of the charging cable 300. As indicated above, the filter 550 may be configured to match the pulse shape of the pulse-shaping filter 520. After optional conversion to the digital domain by the ADC 535, the multiplicator 560 multiplies the filtered input voltage signal and the (pseudo-)random spreading sequence. The numerical integrator 570 performs an integration over time of the result of the multiplication. The integration period is synchronous to the (pseudo-)random spreading sequence, i.e. the integration is performed over the given length (duration). By the above multiplication and subsequent integration over time, the multiplicator 560 and the numerical integrator 580 calculate the correlation (cross-correlation) between the (pseudo-)random spreading sequence and the filtered input voltage signal. The impedance computation may be performed in the digital domain. The impedance of the cable assembly including the charging cable 300 can be calculated when the current modulation amplitude, the correlation output, and the length of the (pseudo-)random spreading sequence are known.

The cable monitoring circuit illustrated in FIGS. 2A and 2B is described in more detail below.

The sequence generator 510 generates a spreading sequence s(t). The spreading sequence is a (pseudo-)random sequence. In embodiments, the spreading sequence is a binary sequence, during each of the symbol periods of which one of two possible symbols (symbol values) is attained, e.g. 0, 1 or ±1.

In the remainder of the present disclosure, without intended limitation, reference will be made to a binary sequence as the spreading sequence. The entirety of the present disclosure is understood to also relate to the general case of a spreading sequence that is not a binary sequence. For instance, the spreading sequence may also be a ternary sequence (having three possible symbol values), quaternary sequence (having four possible symbol values) and so forth. In general, the spreading sequence can be said to have N different symbol values, with N equal to or greater than two.

The binary sequence has a given length and a given symbol period, the given length being equal to the number of symbols (number of symbol periods) in the binary sequence times the symbol period. An example of the binary sequence s(t) for symbol values +1 and −1 is illustrated in the top right panel in FIG. 5.

Figure 4:
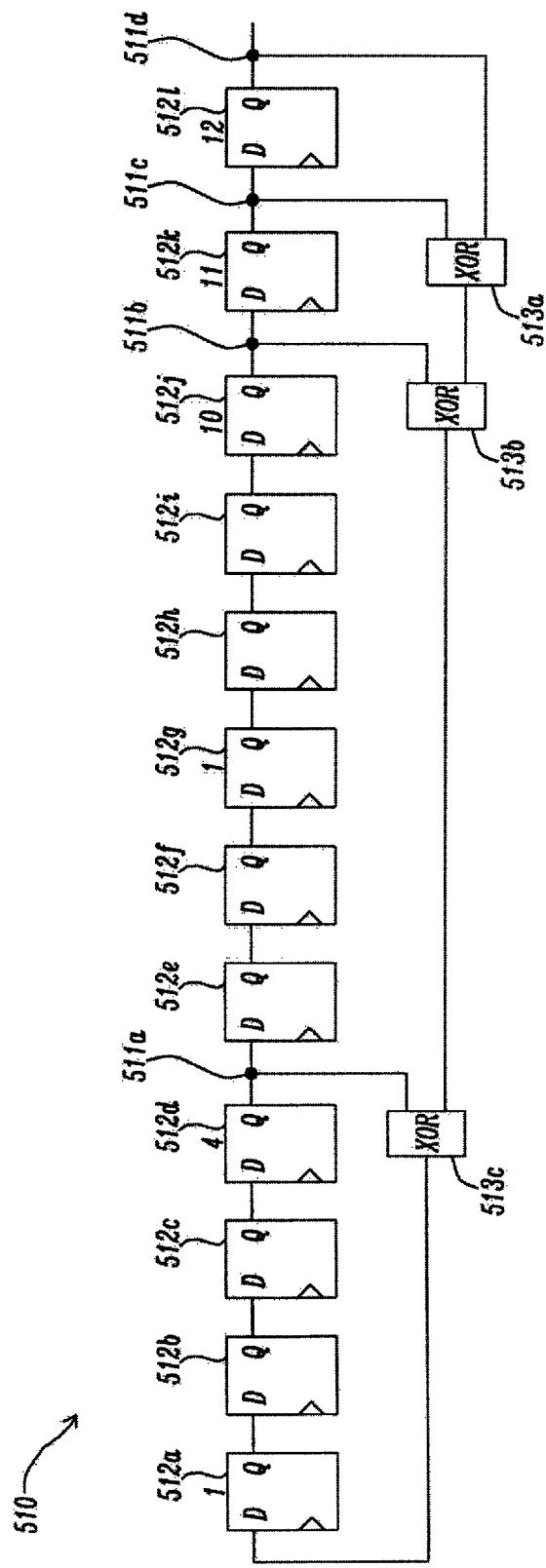
FIG. 4 is a schematic representation of a circuit for generating a pseudo-random binary sequence.

The sequence generator 510 may comprise a linear feedback shift-register structure for generating the (pseudo-)random binary sequence. An example of such linear feedback shift-register structure is illustrated in FIG. 4. The linear feedback shift-register structure comprises a plurality of shift registers 512a-512j that are connected in series from a first shift register to a last shift register. Outputs of a given subset of the shift registers are tapped at corresponding nodes 511a-511c between shift registers and are fed to first ports of respective corresponding logical XOR gates 513a-513c. The XOR gates are connected in series from a first XOR gate to a last XOR gate, so that an output of a given XOR gate is input to a second port of the next XOR gate in the series. An output of the last shift register 511d is fed to the second port of the first XOR gate in the series. An output of the last XOR gate 513c in the series is fed to the first shift register 512a. In the example of FIG. 4, the outputs of the fourth, tenth and twelfth shift registers are tapped and fed to respective corresponding XOR gates. While FIG. 4 illustrates a particular example of a linear shift register structure, it is understood that the number of shift registers, the number of XOR gates, and the positions of the nodes at which the inputs for the respective XOR gates are tapped are not limited to this particular example.

In general, a pseudo-random binary sequence of length $L_{PSR}=2^N-1$ can be generated with a linear shift-register structure of length N (i.e. comprising N shift registers). The feedback network for the shift-register can be described by a polynomial. For the example illustrated in FIG. 4, the polynomial for generating the pseudo-random sequence of length $L_{PSR}=4096$ is given by $x^{12}+x^{11}+x^{10}+x^4+1$.

The modulation (variation) of the current by the current sink 540 has to be performed at a frequency (i.e. in a frequency range) for which the impedance of the cable 300 is mostly resistive. At the upper end, the frequency range is limited by the resonance frequency of the cable 300 (typically at approximately 23 kHz). At the lower end, the frequency range is limited to 5 kHz. Below this frequency, the regulation bandwidth of the fly-back converter of the power supply 200 will start affecting the results of the determination of the impedance of the cable assembly. The factors cable length and output capacitance of the power supply 200 also affect the frequency selection.

In accordance with the above, the cable 300 can be regarded as a band-limited transmission channel. Therefore, the current modulation has to be bandwidth-limited, e.g. by pulse shape filtering or as a by-product of the design of the current-sink 540, in order to prevent inter-symbol interference (ISI). Although typically the chip rate of the current modulation by the current sink 540 is quite low, using a rectangular pulse shape for modulating the current would generate an indefinite transmission bandwidth, and transmitting the resulting signal through a band-limited channel would result in ISI.

In embodiments, to achieve bandwidth limitation of the current modulation (time-dependent current variation), the binary sequence s(t) output by the sequence generator 510 is fed to the pulse-shaping filter 520, which may be a FIR filter, such as a raised cosine filter, for example. The modulation signal output by the pulse-shaping filter 520 (control signal for controlling the current sink 540) can be written in the form $$m(t) = \sum_k a_k p(t - kT_S)$$

where $a_k$ is the k-th element (symbol) of the binary sequence and p(t) is the used pulse-shape. In order to prevent ISI, the time-domain requirement for the pulse shape is $$p(t) = \begin{cases} 1 & \text{when } t = 0 \\ 0 & \text{when } t = \pm T_S, \pm 2T_S, \pm 3T_S, \ldots \end{cases}$$

where $T_S$ is the sample period (symbol period or symbol length). This requirement is fulfilled e.g. by a raised cosine pulse as output by a raised cosine filter.

The modulation signal output by the pulse-shaping filter 520 is optionally subjected to digital-to-analog conversion by the DAC 530.

The controllable current sink 540 (controllable current generator) generates a regulated load current (current modulation, time-dependent current variation) $\Delta i(t)$ which is controlled in accordance with the binary sequence s(t). In more detail, the controllable current sink 540 generates the regulated load current in accordance with the modulation signal m(t), optionally after digital-to-analog conversion by the DAC 530.

In other words, the current modulation $\Delta i(t)$ generated by the current sink 540 is controlled by the binary sequence s(t). The signal actually controlling the current modulation by the current sink 540 is the output of the sequence generator 510 after pulse-shape filtering.

The current sink 540 may be adapted to drain a current i(t) from the one end of the cable 300 that is proportional to the modulation signal m(t), i.e. the time-dependent current variation is proportional to the modulation signal m(t).

As will be explained below, the amplitude $A_i$ of the current modulation may be very low (e.g. about 10 mA). That is, the amplitude $A_i$ of the current modulation may be chosen very small compared to a current of powering the mobile device, e.g. a current of charging the battery 130 of the mobile device 100. A small amplitude $A_i$ of the current modulation has the advantage that applying the current modulation does not affect the actual process of powering the mobile device 100. Moreover, applying a current modulation with small amplitude $A_i$ results in only small power consumption for generating the current modulation.

The current sink 540 is electrically connected to the receptacle 110 of the mobile device 100 so that the regulated load current may be applied to one end of the cable 300. As a result, the cable monitoring circuit 500 introduces, through the current sink 540, a (pseudo-random or random) current variation $\Delta i(t)$ in the current of powering the mobile device 100.

Applying the time-dependent current variation (i.e. the modulated load current) to the one end of the cable 300 generates a voltage variation $\Delta v(t)$ at the one end of the cable 300 proportional to the impedance of the cable assembly including the cable 300. The impedance of the cable assembly can be computed when the binary sequence s(t), the voltage variation $\Delta v(t)$ and the amplitude of the current variation $\Delta i(t)$ are known. This computation gives the total impedance of the cable assembly, from the output capacitors of the power supply 200 to the input of the (charging) circuitry of the mobile device 100.

In order to determine the voltage variation $\Delta v(t)$ that is needed for calculating the impedance, a voltage signal (time-dependent voltage) that is detected at the one end of the cable 300 is filtered by filter 550, which may be a BPF or a HPF, for example. In general, the filter 550 is a filter adapted to remove a DC component of the detected voltage signal. The filter 550 may also be matched with the pulse shape of the pulse-shaping filter 520.

Optionally, the output of the filter 550 is subjected to analog-to-digital conversion by the ADC 535. Accordingly, computation of the impedance of the cable assembly may be performed in the digital domain.

The impedance measurement (impedance calculation) is based on direct-sequence spread-spectrum methodology. Using the spread-spectrum approach, the de-spreading gain provides a good protection against any narrowband noise in the powering system (e.g. charging system), including the switching noise of the power supply 200. The amplitude $A_i$ of the (pseudo-random or random) current modulation can be kept very low (e.g. around 10 mA), and the de-spreading gain will still provide protection against any noise in the charging system. Furthermore, because of the (pseudo-)random quality of the current variation, the current modulation signal will appear as noise even though the center frequency of the current modulation would be in the audible range. In the context of the spread spectrum approach, the (pseudo-)random binary sequence may be referred to as (pseudo-)random spreading sequence, as has been done above.

Before demodulation (de-spreading), the voltage signal $\Delta v(t)$, after removal of the DC component by the filter 550, has to be filtered with a pulse shape matching the pulse shape of the pulse-shaping filter 520. As indicated above, this may be done by matching the filter 550 to the pulse shape of the pulse-shaping filter 520, or alternatively by providing the second pulse-shaping filter 525, which is a matched filter to the (first) pulse-shaping filter 520.

In order to determine the impedance of the cable assembly including the cable 300, the cable monitoring circuit 500 needs to detect the amplitude of the voltage variation $\Delta v(t)$ and the amplitude $A_i$ of the current variation $\Delta i(t)$ at the one end of the cable 300. If the current variation is implemented with a regulated current sink, the amplitude $A_i$ of the current variation $\Delta i(t)$ is known and does not need to be measured. Also, if only a rate of change of the impedance is to be monitored, it is not required to measure or know the amplitude $A_i$ of the current variation $\Delta i(t)$.

The determination of the amplitude of the voltage variation $\Delta v(t)$ is performed by de-spreading the voltage variation $\Delta v(t)$ with the binary sequence s(t) over one sequence period, i.e. over the length (duration) of the binary sequence. The actual de-spreading is performed by the multiplicator 560 and the numerical integrator 570, which, acting together, perform a (cross-)correlation of the time-dependent voltage variation $\Delta v(t)$ with the (pseudo-)random binary sequence s(t).

The multiplier 560 multiplies the time-dependent voltage variation $\Delta v(t)$ with the (pseudo-)random binary sequence s(t) in order to perform the de-spreading. In other words, the multiplier 560 down-converts the filtered input signal to zero frequency by multiplying it with the (pseudo-)random binary sequence. The multiplication performed here is an instantaneous multiplication, i.e. for each point in time a value of the voltage variation is multiplied by the corresponding value of the binary sequence. The (pseudo-)random binary sequence that is used here is the same that is used to generate (control) the current modulation, and hence, the filtered input signal and the binary sequence are synchronized (aligned) with each other. Any remaining phase shift between the binary sequence and the voltage variation may be removed by the phase shifter 565, which appropriately shifts the phase of the binary sequence before supplying it to the multiplier 560. Multiplying the time-dependent voltage variation $\Delta v(t)$ with the binary sequence s(t) may require shifting the level of the binary sequence s(t) so that the symbol values of the binary sequence are symmetric with respect to zero, e.g. symbol values +1 and −1. The multiplicator 560 may also be said to invert parts of the time-dependent voltage variation in accordance with the binary sequence.

The result of the above multiplication is given by $$r(t) = \Delta v(t) \times s(t).$$

This result of the multiplication is, to good approximation, a constant signal with magnitude directly proportional to the impedance of the cable assembly including the cable 300. By averaging over the period of the binary sequence (length or duration of the binary sequence), any interference introduced by the powering system (e.g. charging system) will be filtered out. Averaging over the period of the binary sequence may be performed by a time integration over said period, $$\langle r(t) \rangle = \frac{1}{T} \int_{T0}^{T0+T} r(t) dt.$$

This averaging is performed by the numerical integrator 570. As indicated above, the result <r(t)> of the time averaging (time integration) is indicative of the amplitude of the time-dependent voltage variation Δv(t), and directly proportional to the impedance of the cable assembly including the cable 300.

Thus, the multiplicator 560 and the numerical integrator 570 (cross-)correlate the time-dependent voltage variation Δv(t) with the (pseudo-)random binary sequence s(t) in order to perform the de-spreading, by first performing the above multiplication, and subsequently performing the above integration over time. The multiplicator 560 and the numerical integrator 570 can therefore by said to form correlation means adapted to (cross-)correlate the time-dependent voltage variation Δv(t) with the (pseudo-)random binary sequence s(t).

Figure 5:
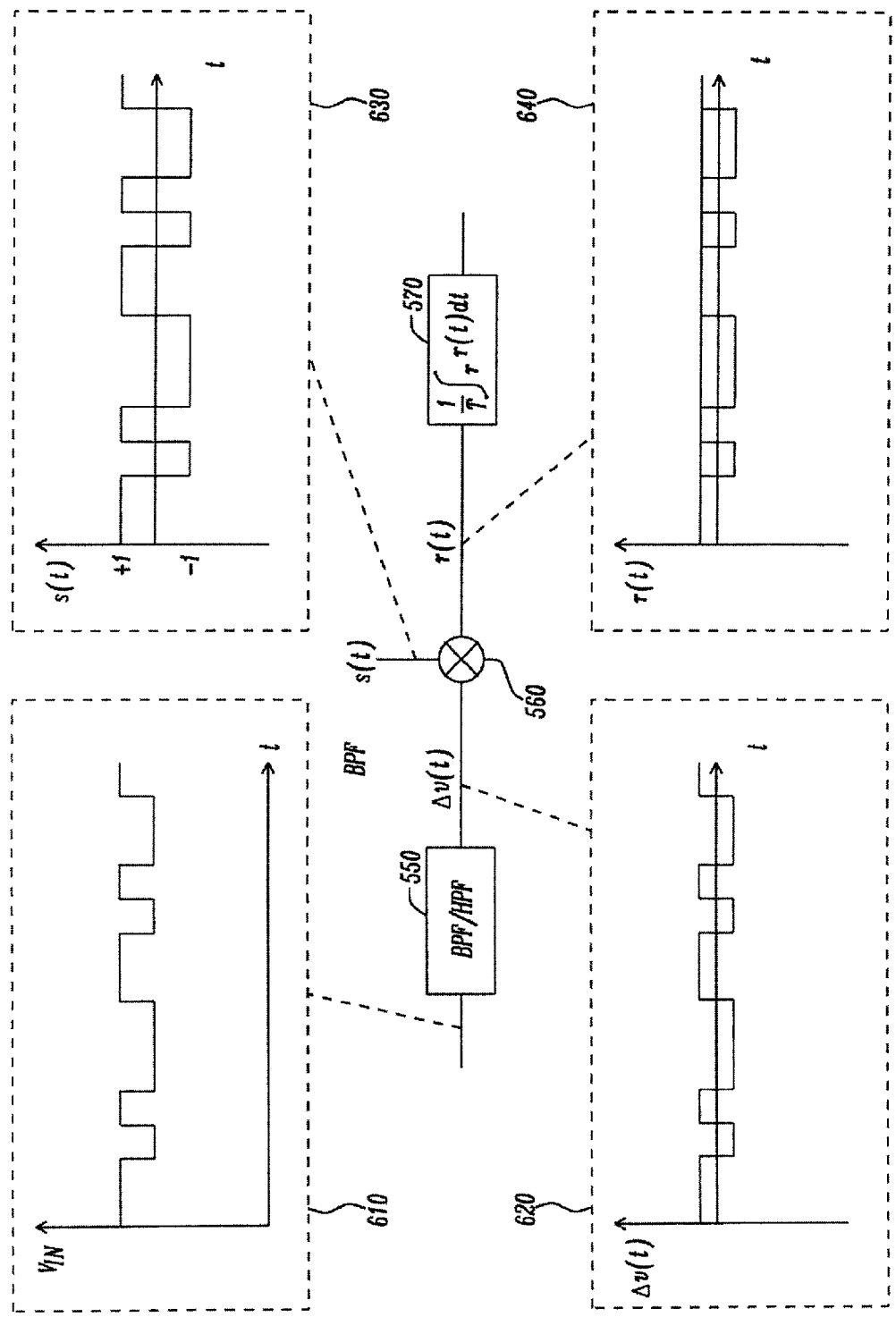
FIG. 5 schematically illustrates the determination of a quantity indicative of an impedance of the cable assembly according to embodiments of the invention.

A conceptual block diagram of the de-spreading and averaging operation is shown in FIG. 5. The time-dependent voltage $V_{IN}$ detected at the one end of the cable 300 is exemplarily shown in the top left panel 610. After filtering (e.g. band pass filtering or high pass filtering) by the filter 550, i.e. after removal of the DC component of the time-dependent voltage, the time-dependent voltage variation Δv(t) exemplarily shown in the bottom left panel 620 is obtained. Multiplying the time-dependent voltage variation Δv(t) with the binary sequence s(t) exemplarily shown in the top right panel 630, after appropriate synchronization by the phase shifter 565 if necessary, yields the approximately constant signal r(t) exemplarily shown in the bottom right panel 640. The magnitude of the approximately constant signal r(t) is a measure of the amplitude of the time-dependent voltage variation Δv(t), and directly proportional to the impedance of the cable assembly including the cable 300. This signal is then subjected to time averaging by time integration over the period of the binary sequence s(t) by the numerical integrator 570.

The impedance $Z_{TOT}$ of the cable assembly including the cable 300 is then given by $$Z_{TOT} = \alpha \frac{\langle r(t) \rangle}{A_i}$$

where $A_i$ is the amplitude of the current modulation and α is a constant. The constant α may depend on a gain of the filter 550 and may be determined in advance. If the filter 550 has unit gain or a gain sufficiently close to unity, the constant α may be omitted.

At the high level, the impedance (or more general, the quantity indicative of the impedance) is calculated based on the time-dependent voltage variation and the binary sequence (spreading sequence). More specifically, the impedance is calculated based on a time average of the result of (cross-)correlating the time-dependent voltage variation with the binary sequence.

The impedance (or more general, the quantity indicative of the impedance) is then provided to the controller 590, which may instruct the charger circuit 120 to adjust the voltage and/or current output by the power supply 200 in accordance with the determined impedance in such a manner that damage to the cable 300, the power supply 200 and the mobile device 100 is prevented. In the case of a charging system, the controller 590 may instruct the charger circuit 120 to control a battery current of the battery 130 of the mobile device 100. The current flowing through the cable 300 is determined by the battery current and the ratio of the battery voltage and the input voltage (i.e. the voltage output by the power supply 200). The controller 590 may be further adapted for instructing, in accordance with the determined quantity indicative of an impedance of the cable assembly including the cable 300 and/or the rate of change of the quantity, the power supply 200 to adjust a current limit of the power supply 200. This instructing of the power supply 200 may proceed through the charger circuit 120.

The impedance calculator 580 may further determine a gradient (rate of change) of the impedance by comparing impedances obtained at different timings. Determining such a gradient may allow identifying situations in which the impedance starts to drift towards high values, and power supply may be regulated or stopped by way of precaution.

Figure 3:
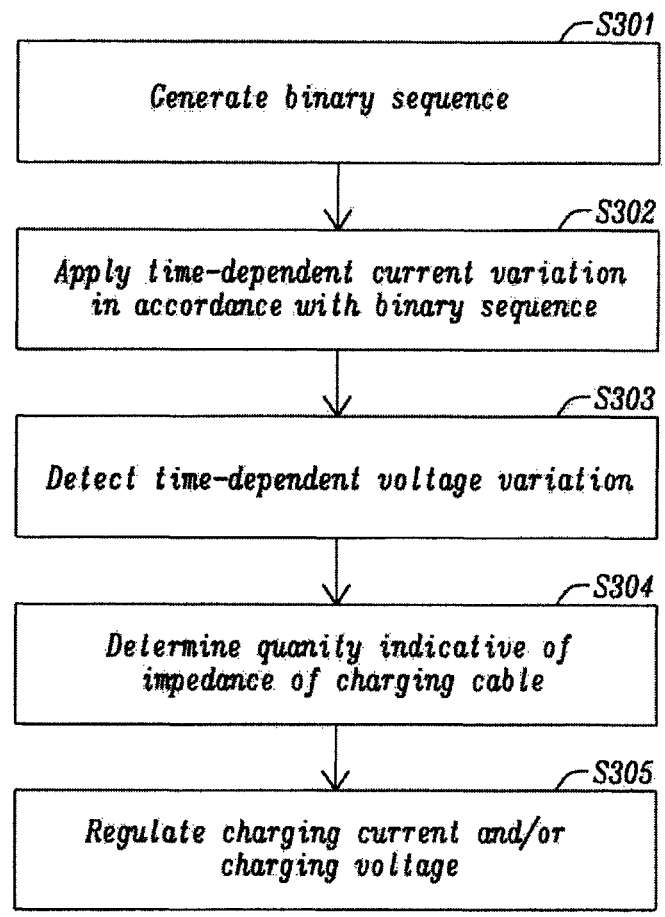
FIG. 3 is a flow-chart schematically illustrating a method for cable monitoring according to embodiments of the invention.

FIG. 3 is a flow-chart schematically illustrating a method for cable monitoring according to embodiments of the invention.

At step S301, the (pseudo-random or random) binary sequence (exemplarily embodying the spreading sequence) is generated. Step S301 is performed by the sequence generator 510. At step S302, a time-dependent current variation (current modulation) controlled in accordance with the binary sequence is applied to the one end of the cable 300. Step S302 is performed by the current sink 540. At step S303, the time-dependent voltage variation resulting from applying the time-dependent current variation is detected. At step S304, the quantity indicative of the impedance of the cable assembly is calculated. Step S304 is performed by the computing means. At step S305, if necessary, the current and/or voltage output by the power supply 200 is adjusted in accordance with the determined quantity. In general terms, the charging power output by the power supply 200 is adjusted at step S305. Step S305 is performed by the controller 590 interacting with the power supply 200.

The binary sequence generated at step S301 is a (pseudo-) random binary sequence. This (pseudo-)random binary sequence has a given length (i.e. duration), which is determined by the number of symbols (symbol periods) in the binary sequence and the symbol period.

Step S302 may involve pulse-shape filtering of the binary sequence s(t) to obtain a modulation signal m(t) for controlling the current modulation, after optional analog-to-digital conversion. The time-dependent current variation Δi(t) may be proportional to the modulation signal m(t). These steps are performed by the pulse-shaping filter 520 and optionally the DAC 530, respectively.

Step S303 may involve detecting a time dependent voltage at the one end of the cable 300 and subjecting the detected voltage signal to filtering such that the DC component of the detected voltage signal is removed. This step is performed at the filter 550. The result of removing the DC component is the time-dependent voltage variation. Step S303 may further involve optionally subjecting the time-dependent voltage variation to analog-to digital conversion. This step is optionally performed by the ADC 535. Step S305 may further involve performing pulse-shape filtering of the time-dependent voltage variation matched to the pulse-shape filtering at step S302. This step may be performed in the filter 550, or alternatively in the second pulse-shaping filter 525.

Step S304 may involve (cross-)correlating the time-dependent voltage variation with the binary sequence. Correlating the time-dependent voltage variation with the binary sequence corresponds to de-spreading the time-dependent voltage variation. Correlating the time-dependent voltage variation with the binary sequence may involve performing an instantaneous multiplication of the time-dependent voltage variation and the binary sequence. This multiplication is performed by multiplicator 560. If necessary, the binary sequence may be shifted in phase before performing said multiplication in order to achieve synchronization (alignment) of the time-dependent voltage variation and the binary sequence. Said phase shifting is performed by the phase shifter 565. Correlating the time-dependent voltage variation with the binary sequence may further involve calculating a time average of the result of the multiplication. This time average may be calculated by performing a time integration of the result of the multiplication over the period (i.e. duration) of the binary sequence. Step S304 may further involve calculating the quantity indicative of the impedance of the cable assembly based on the above time average, as described above.

It should be noted that the description and drawings merely illustrate the principles of the proposed methods and apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and apparatus. Furthermore, all statements herein providing principles, aspects, and embodiments of the invention, as well as specific examples thereof, are intended to encompass equivalents thereof.

What is claimed is:

1. A method of monitoring a process of powering a portable device through a cable connected between a power supply and said portable device, the method comprising:
    applying a time-dependent current variation to one end of the cable in accordance with a spreading sequence;
    detecting a time-dependent voltage variation at the one end of the cable, the time dependent voltage variation resulting from said applying of the time-dependent current variation;
    determining a quantity indicative of an impedance of the cable assembly based on the time-dependent voltage variation and the spreading sequence, and;
    correlating the time-dependent voltage variation with the spreading sequence,
    wherein said determining the quantity indicative of the impedance of the cable assembly is based on the result of said correlating,
    wherein said correlating involves:
    multiplying the time-dependent voltage variation and the spreading sequence; and
    averaging over time the result of said multiplication.

2. The method according to claim 1, further comprising generating the spreading sequence.

3. The method according to claim 1, wherein the spreading sequence is a pseudo-random or random sequence.

4. The method according to claim 1, wherein the spreading sequence is a binary sequence.

5. The method according to claim 1, wherein the cable is a pluggable cable with standardized connectors.

6. The method according to claim 1, wherein the power supply is a switched power supply.

7. The method according to claim 1, wherein said correlating further involves:
    synchronizing the time-dependent voltage variation and the spreading sequence.

8. The method according to claim 1,
    wherein the spreading sequence has a given length; and
    wherein said averaging over time involves performing a time integration, over the given length, of the result of said multiplication.

9. The method according to claim 1, wherein said detecting the time-dependent voltage variation involves:
    detecting a time-dependent voltage at the one end of the cable; and
    removing a DC component of the detected time dependent voltage.

10. The method according to claim 1, wherein the amplitude of the time-dependent current variation is chosen such that the time-dependent voltage variation is small compared to a voltage for powering the portable device.

11. The method according to claim 1, further comprising:
    comparing values of the quantity indicative of the impedance of the cable assembly obtained at different timings;
    determining a rate of change of the quantity indicative of the impedance of the cable assembly based on the result of said comparison.

12. The method according to claim 1, further comprising:
    adjusting a current and/or a voltage output by the power supply in accordance with the determined quantity indicative of the impedance of the cable assembly.

13. An apparatus for monitoring a process of powering a portable device through a cable connected between a power supply and said portable device, the apparatus comprising:
    a current sink for applying a time-dependent current variation to one end of the cable in accordance with a spreading sequence;
    voltage detecting means for detecting a time-dependent voltage variation at the one end of the cable, the time dependent voltage variation resulting from said applying of the time-dependent current variation; and
    computing means for determining a quantity indicative of an impedance of the cable assembly based on the time-dependent voltage variation and the spreading sequence,
    wherein the computing means comprises a multiplicator adapted to multiply the time-dependent voltage variation with the spreading sequence, a numerical integrator adapted to time-average the result of said multiplication, and an impedance calculator adapted to calculate the quantity indicative of the impedance of the cable assembly based on the time average.

14. The apparatus according to claim 13, wherein
    the spreading sequence has a given length; and
    wherein said numerical integrator is adapted to time-average the result of said multiplication by performing a time integration, over the given length, of the result of said multiplication.

15. The apparatus according to claim 13,
    wherein the voltage detecting means is adapted to detect a time-dependent voltage at the one end of the cable; and wherein the apparatus comprises a filter adapted to remove a DC component of the time dependent voltage.

16. The apparatus according to claim 13, further comprising a sequence generator for generating the spreading sequence.

17. The apparatus according to claim 16, wherein the sequence generator is adapted to generate the spreading sequence as a pseudo-random or random sequence.

18. The apparatus according to claim 16, wherein the sequence generator is adapted to generate the spreading sequence as a binary sequence.

19. The apparatus according to claim 16, wherein the sequence generator comprises a linear feedback shift-register structure.

20. The apparatus according to claim 13, further comprising a pulse-shaping filter for generating a control signal for controlling the current sink based on the spreading sequence.

21. The apparatus according to claim 20, wherein the pulse-shaping filter is a finite impulse response filter, in particular a raised cosine filter.

22. The apparatus according to claim 13, further comprising a controller for generating a command to adjust a current and/or a voltage output by the power supply in accordance with the determined quantity indicative of an impedance of the cable assembly.

23. The apparatus according to claim 13,
wherein the computing means further comprises a phase shifter for synchronizing the time-dependent voltage variation and the spreading sequence.

* * * * *